United States Patent
Tsuchiya et al.

(10) Patent No.: US 9,579,769 B2
(45) Date of Patent: Feb. 28, 2017

(54) COMPOSITION FOR POLISHING PURPOSES, POLISHING METHOD USING SAME, AND METHOD FOR PRODUCING SUBSTRATE

(71) Applicant: FUJIMI INCORPORATED, Kiyosu-shi, Aichi (JP)

(72) Inventors: Kohsuke Tsuchiya, Kiyosu (JP); Yoshio Mori, Kiyosu (JP); Shinichiro Takami, Kiyosu (JP); Shuhei Takahashi, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/352,393

(22) PCT Filed: Oct. 9, 2012

(86) PCT No.: PCT/JP2012/076125
§ 371 (c)(1),
(2) Date: Apr. 17, 2014

(87) PCT Pub. No.: WO2013/061771
PCT Pub. Date: May 2, 2013

(65) Prior Publication Data
US 2014/0302752 A1    Oct. 9, 2014

(30) Foreign Application Priority Data
Oct. 24, 2011 (JP) ................................. 2011-233208

(51) Int. Cl.
B24B 37/04 (2012.01)
H01L 21/304 (2006.01)
C09K 3/14 (2006.01)
H01L 21/02 (2006.01)
C09G 1/02 (2006.01)

(52) U.S. Cl.
CPC .............. *B24B 37/044* (2013.01); *C09G 1/02* (2013.01); *C09K 3/1463* (2013.01); *H01L 21/02024* (2013.01); *H01L 21/304* (2013.01)

(58) Field of Classification Search
CPC ........ B24B 37/044; H01L 21/304; C09G 1/02
USPC ................. 451/36, 37, 41; 252/79.1
See application file for complete search history.

(56) References Cited

U.S. PATENT DOCUMENTS

| | | |
|---|---|---|
| 6,685,757 B2 | 2/2004 | Xu et al. |
| 7,867,909 B2 | 1/2011 | Uemura |
| 2003/0154659 A1 | 8/2003 | Xu et al. |
| 2004/0098924 A1 | 5/2004 | Iwasa |
| 2004/0127046 A1 | 7/2004 | Takami |
| 2004/0127047 A1 | 7/2004 | Yamada et al. |
| 2006/0090402 A1 | 5/2006 | Uemura |
| 2007/0077764 A1* | 4/2007 | Shimizu ....................... 438/691 |
| 2007/0093183 A1* | 4/2007 | Yoshikawa et al. ............ 451/41 |
| 2007/0186485 A1 | 8/2007 | Iwasa |
| 2007/0186486 A1 | 8/2007 | Iwasa |
| 2008/0003925 A1* | 1/2008 | Fukasawa et al. ............... 451/37 |
| 2008/0051010 A1 | 2/2008 | Uemura |
| 2008/0127573 A1* | 6/2008 | Roh et al. ........................ 51/298 |
| 2009/0137123 A1 | 5/2009 | Uemura |
| 2009/0298393 A1* | 12/2009 | Kozasa ........................... 451/41 |
| 2010/0003821 A1 | 1/2010 | Morinaga et al. |
| 2010/0112728 A1* | 5/2010 | Korzenski ......... H01L 21/02079 438/3 |
| 2010/0301014 A1 | 12/2010 | Mizuno et al. |
| 2011/0183581 A1 | 7/2011 | Otsu et al. |
| 2012/0138851 A1 | 6/2012 | Uemura |
| 2013/0040461 A1 | 2/2013 | Uemura |

FOREIGN PATENT DOCUMENTS

| | | |
|---|---|---|
| JP | 2001-015461 A | 1/2001 |
| JP | 2004-128070 A | 4/2004 |
| JP | 2005-158867 A | 6/2005 |
| JP | 2005-518668 A | 6/2005 |
| JP | 2006-128518 A | 5/2006 |
| JP | 2008-053415 A | 3/2008 |
| JP | 2009-290139 A | 12/2009 |
| JP | 2010-10454 A | 1/2010 |
| JP | 2010-34509 A | 2/2010 |
| JP | 2010-99757 A | 5/2010 |
| WO | WO 03/072669 A2 | 9/2003 |
| WO | WO 2009/096495 A1 | 8/2009 |
| WO | WO 2009/154164 A1 | 12/2009 |
| WO | WO 2010-122985 A1 | 10/2010 |

\* cited by examiner

*Primary Examiner* — Robert Rose
(74) *Attorney, Agent, or Firm* — Foley & Lardner LLP

(57) ABSTRACT

Provided is a polishing composition, which comprises abrasive grains, a water-soluble polymer, an aggregation inhibitor and water. The ratio R1/R2 is 1.3 or less, where R1 represents the average particle diameter of the particles present in the polishing composition and R2 represents the average particle diameter of the abrasive grains when the abrasive grains are dispersed in water at the same concentration as that of the abrasive grains in the polishing composition. The polishing composition can be used mainly for polishing the surface of a silicon substrate.

14 Claims, No Drawings

COMPOSITION FOR POLISHING PURPOSES, POLISHING METHOD USING SAME, AND METHOD FOR PRODUCING SUBSTRATE

TECHNICAL FIELD

The present invention relates to a polishing composition used for polishing a substrate, a method for polishing a substrate by using the polishing composition, and a method for producing a substrate.

BACKGROUND ART

In semiconductor devices for use in computers, miniaturization of wiring widths, referred to as design rules, has advanced year by year in order to realize further higher integration and higher speed. Therefore, there are an increased number of cases where nanometer-scaled substrate surface defects, which had not been conventionally problematic, have adverse effects on performances of semiconductor devices. Accordingly, it is highly important to deal with nanometer-scaled substrate surface defects.

For polishing a silicon substrate among semiconductor substrates, a polishing composition containing silica particles and a water-soluble polymer is suitably used (see, for example, Patent Document 1). The polishing composition disclosed in Patent Document 1 forms a protective film derived from the water-soluble polymer on the surface of a polished silicon substrate. This protective film imparts hydrophilicity to the surface of the polished substrate, thereby making easier handling of the polished substrate. However, the water-soluble polymer used for the polishing composition has a molecular weight of several hundred thousands or more, and thus forms aggregates together with the silica particles. The aggregates made of the silica particles and the water-soluble polymer may cause substrate surface defects, which are referred to as light point defects (LPDs).

In order to reduce LPDs due to aggregates made of silica particles and water-soluble polymer, it is important to eliminate aggregates from the polishing composition. As one example therefor, it is effective that when polishing composition containing silica particles and water-soluble polymer is produced and used, the polishing composition be subjected to filtration by a filter to remove aggregates. However, the polishing composition immediately causes clogging of the filter, and thus there is a problem that the filter must be frequently exchanged.

In order to improve the dispersibility of abrasive grains in a polishing composition, compounding of a dispersant or the like in the polishing composition has been proposed. Patent Document 2 discloses that a surfactant is added to a polishing composition to thereby improve the dispersibility of abrasive grains. However, the polishing composition disclosed in Patent Document 2 includes no water-soluble polymer that has a molecular weight of several hundred thousands or more and is predicted to form aggregates together with abrasive grains. Patent Document 2 only discloses that the polishing composition to which the surfactant is added is used to thereby improve the polishing rate of a wafer.

Patent Document 3 discloses a water-based dispersion for polishing, containing a water-soluble polymer, and a surfactant as dispersants. However, the water-based dispersion for polishing includes no water-soluble polymer having a molecular weight of several hundred thousands or more, the polymer being predicted to form aggregates together with abrasive grains. Patent Document 3 only discloses that the water-based dispersion for polishing, to which the dispersants are added, is used to thereby reduce scratches on a copper film.

Furthermore, Patent Document 4 discloses a polishing composition containing at least one water-soluble polymer selected from polyvinylpyrrolidone and poly(N-vinylformamide), and an alkali. It also discloses that the polishing composition is effective for reducing LPDs. However, Patent Document 4 discloses no polishing composition including a water-soluble polymer having a molecular weight of several hundred thousands or more, the polymer being predicted to form aggregates together with abrasive grains, and it does not disclose the dispersibility of abrasive grains.

Accordingly, there is a need for a polishing composition that imparts high hydrophilicity to the surface of a polished substrate, reduces LPDs, and achieves a high dispersibility of abrasive grains.

PRIOR ART DOCUMENTS

Patent Document 1: Japanese National Phase Laid-Open Patent Publication No. 2005-518668
Patent Document 2: Japanese Laid-Open Patent Publication No. 2001-15461
Patent Document 3: Japanese Laid-Open Patent Publication No. 2005-158867
Patent Document 4: Japanese Laid-Open Patent Publication No. 2008-53415

SUMMARY OF THE INVENTION

Problems that the Invention is to Solve

An objective of the present invention is to provide a polishing composition that imparts high hydrophilicity to the surface of a polished substrate, reduces LPDs on the surface of a polished substrate, contains a water-soluble polymer, and abrasive grains highly dispersed therein. Another objective of the present invention is to provide a method for polishing a substrate by using the polishing composition, and a method for producing a substrate.

Means for Solving the Problems

To achieve the foregoing objective and in accordance with one aspect of the present invention, a polishing composition is provided that contains abrasive grains, a water-soluble polymer, an aggregation inhibitor, and water. When an average particle size of the particles present in the polishing composition is defined as R1 and an average particle size of the abrasive grains in the case where the abrasive grains are dispersed in water so as to have the same concentration as the concentration of the abrasive grains in the polishing composition is defined as R2, R1/R2 is 1.3 or less.

Another aspect of the present invention provides a method for polishing a silicon substrate by using the polishing composition according to the above aspect. Still another aspect of the present invention provides a method for producing a silicon substrate, including a step of polishing a silicon substrate by using the polishing composition according to the above aspect.

Effects of the Invention

According to the present invention, provided are a polishing composition that imparts high hydrophilicity to the surface of a silicon substrate polished and includes abrasive grains having high dispersibility; a method for polishing a substrate by using the same; and a method for producing a substrate.

MODES FOR CARRYING OUT THE INVENTION

Hereinafter, an embodiment of the present invention will be described.

A polishing composition of the present embodiment is prepared by mixing abrasive grains, a water-soluble polymer, an aggregation inhibitor, and water, and if necessary adding a basic compound.

The abrasive grains serve to physically polish the surface of a substrate. Specific examples of the abrasive grains include those made of silicon carbide, silicon dioxide, alumina, ceria, zirconia, calcium carbonate, and diamond. When the polishing composition is used for polishing a semiconductor substrate, in particular, a silicon substrate, the abrasive grains are preferably made of silicon dioxide, more preferably colloidal silica or fumed silica, further preferably colloidal silica. If colloidal silica or fumed silica, in particular colloidal silica is used, scratches generated on the surface of a substrate in a polishing step are reduced. The abrasive grains may be used singly or in combination of two or more.

In general, in a polishing composition containing a water-soluble polymer and abrasive grains, aggregates of the abrasive grains mediated by the water-soluble polymer are easily formed. Therefore, the polishing composition containing a water-soluble polymer and abrasive grains tends to have a larger average particle size of the particles present in the polishing composition than a polishing composition containing no water-soluble polymer. However, the term "particles present in the polishing composition" herein is used as a term encompassing not only the aggregates of the abrasive grains mediated by the water-soluble polymer, but also abrasive grains forming no aggregates.

The average particle size of the particles present in the polishing composition of the present embodiment is preferably 10 nm or more, and more preferably 20 nm or more. Herein, the value of the average particle size is a volume average particle size measured by a particle size distribution measuring apparatus in accordance with a dynamic light scattering method.

The average primary particle size of the abrasive grains is preferably 5 nm or more, and more preferably 10 nm or more. Herein, the value of the average primary particle size of the abrasive grains can be calculated based on the specific surface area of the abrasive grains, measured by the BET method.

When the average particle size of the particles present in the polishing composition and the average primary particle size of the abrasive grains are in the above ranges, the surface processing performance such as the polishing rate of a silicon substrate is improved.

The average particle size of the particles present in the polishing composition is preferably 200 nm or less, and more preferably 100 nm or less.

The average primary particle size of the abrasive grains is preferably 100 nm or less, and more preferably 50 nm or less.

When the average particle size of the particles present in the polishing composition and the average primary particle size of the abrasive grains are in the above ranges, the dispersion stability of the abrasive grains in the polishing composition is improved. As a result, even when the polishing composition is subjected to filtration using a filter having a small mesh size, a good filtration property is achieved.

In the volume based particle size distribution of the abrasive grains, measured by a particle size distribution measuring apparatus in accordance with a dynamic light scattering method, the value D90/D10 is between 1 and 4, inclusive, where the value D90/D10 is obtained by dividing the particle size D90, at which the cumulative particle size distribution from smaller particle size reaches 90%, by the particle size D10, at which the cumulative particle size distribution from smaller particle size reaches 10%. When the D90/D10 is in this range, the polishing rate is higher and a polished surface excellent in smoothness is obtained.

The abrasive grains preferably have a non-spherical shape. Examples of the non-spherical shape include an ellipsoidal shape having a constricted part at a central portion, which is referred to as a peanut shell shape, a spherical shape having a plurality of projections on the surface, and a rugby ball shape. In addition, the abrasive grains may have a structure in which two or more primary particles are associated with each other. Herein, the index of the non-spherical shape is expressed by an aspect ratio. The aspect ratio is calculated as follows. In a scanning electron micrograph of the abrasive grains, the minimum bounding rectangle with respect to each of the abrasive grains is defined. Then, the length of a long side is divided by the length of a short side with respect to each minimum bounding rectangle. Subsequently, the average of the resulting values is determined.

The aspect ratio of the abrasive grains is preferably more than 1, further preferably 1.1 or more, and further preferably 1.2 or more. When the aspect ratio of the abrasive grains is in the above range, the polishing rate of a silicon substrate by the polishing composition is improved.

The aspect ratio of the abrasive grains is preferably 4.0 or less, more preferably 3.0 or less, and further preferably 2.5 or less. When the aspect ratio of the abrasive grains is in the above range, the occurrence of surface defects and the increase in surface roughness after polishing an object by using the polishing composition is suppressed.

The content of the abrasive grains in the polishing composition is preferably 0.01% by weight or more. When the content of the abrasive grains is in the above range, a surface processing performance such as the polishing rate of a silicon substrate is improved.

The content of the abrasive grains in the polishing composition is preferably 5% by weight or less, more preferably 1% by weight or less, and further preferably 0.5% by weight. When the content of the abrasive grains is in the above range, the dispersion stability of the polishing composition is improved, and the residue of the abrasive grains after polishing is reduced, thereby reducing LPDs.

The water-soluble polymer in the polishing composition serves to impart hydrophilicity to the surface of a polished substrate. If the hydrophilicity on the surface of a substrate is deteriorated, the components in the polishing composition and foreign substances generated from the substrate remain on the substrate, causing the deterioration in cleanliness of the surface of the substrate cleaned. Therefore, the surface accuracy of the substrate may be lowered. Furthermore, the water-soluble polymer also has such a property as to cross-link the abrasive grains to form aggregates. Examples of the water-soluble polymer include celluloses and polysaccharides. Specific examples of the celluloses include hydroxyethylcellulose, hydroxypropylcellulose, and carboxymethylcellulose. Specific examples of the polysaccharides include starch, cyclodextrin, trehalose, and pullulan. From the viewpoint of imparting high wettability and good cleanliness after cleaning to the surface of a substrate, the water-soluble polymer is preferably a cellulose, and more preferably hydroxyethylcellulose.

The weight average molecular weight of the water-soluble polymer in the polishing composition is preferably 10,000 or more. When the weight average molecular weight of the water-soluble polymer is in the above range, the hydrophilicity to be imparted to the surface of a silicon substrate is improved.

The weight average molecular weight of the water-soluble polymer in the polishing composition is preferably 2,000,000 or less, more preferably 1,000,000 or less, further preferably 500,000 or less, and most preferably 300,000 or less. When the weight average molecular weight of the water-soluble polymer is in the above range, the dispersion stability of the polishing composition is improved, and the cleanliness of a silicon substrate cleaned is improved.

The content of the water-soluble polymer in the polishing composition is preferably 0.0001% by weight or more, more preferably 0.001% by weight or more, and further preferably 0.005% by weight or more. When the content of the water-soluble polymer is in the above range, the hydrophilicity to be imparted to the surface of a silicon substrate is improved.

The content of the water-soluble polymer in the polishing composition is preferably 0.5% by weight or less, more preferably 0.1% by weight or less, and further preferably 0.05% by weight or less. When the content of the water-soluble polymer is in the above range, the dispersion stability of the polishing composition is improved.

When the abrasive grains and the water-soluble polymer are present in the same solvent, the aggregation inhibitor in the polishing composition generally exhibits the action of suppressing aggregation of the abrasive grains by the water-soluble polymer. When the abrasive grains and the water-soluble polymer co-exist, it is considered that the water-soluble polymer adsorbs to the abrasive grains and the abrasive grains aggregate via the water-soluble polymer. On the other hand, under the presence of the aggregation inhibitor, the water-soluble polymer and the aggregation inhibitor competitively adsorb to the abrasive grains. Thus, it is considered that the aggregation force between the abrasive grains is weakened as compared with the case where only the water-soluble polymer adsorbs to the abrasive grains, resulting in the improvement in dispersibility. The improvement in dispersibility of the abrasive grains is specifically manifests itself as the effect of improving filtration property of the polishing composition.

As the aggregation inhibitor, a common compound can be used as long as the compound has the above effect. Examples of the aggregation inhibitor include vinyl-based water-soluble polymers, oxyalkylene polymers, oxyalkylene copolymers, and silicone polymers. Specific examples of the vinyl-based water-soluble polymer include polyvinylpyrrolidone, polyvinylcaprolactam, polyacrylamide, and polyacrylic acid. Specific examples of the oxyalkylene polymer include polyethylene glycol and polypropylene glycol. Further examples of the oxyalkylene copolymer include diblock, triblock, random, and alternate copolymers of polyoxyethylene and polyoxypropylene. Specific examples of the oxyalkylene copolymer include polyoxyethylene-polyoxypropylene-polyoxyethylene triblock copolymers. Specific examples of the silicone polymer include polyether-modified silicone. From the viewpoint of imparting high dispersibility to the polishing composition, the aggregation inhibitor is preferably one or more selected from the vinyl-based water-soluble polymer, the oxyalkylene copolymer, and the silicone polymer, and further preferably one or more selected from the vinyl-based water-soluble polymers and the oxyalkylene polymers. From the viewpoint of improvement in hydrophilicity, the aggregation inhibitor is more preferably one or more selected from polyvinylpyrrolidone and polyoxyethylene-polyoxypropylene-polyoxyethylene triblock copolymers.

The weight average molecular weight of the aggregation inhibitor in the polishing composition is preferably 300 or more, more preferably 1,000 or more, and further preferably 3,000 or more. In addition, the weight average molecular weight is preferably 2,000,000 or less, more preferably 1,000,000 or less, further preferably 500,000 or less, and most preferably 100,000 or less. When the weight average molecular weight of the aggregation inhibitor is in the above range, the dispersion stability of the polishing composition is improved.

The content of the aggregation inhibitor in the polishing composition is preferably 0.00001% by weight or more, more preferably 0.0001% by weight or more, further preferably 0.001% by weight or more, further more preferably 0.002% by weight or more, and most preferably 0.005% by weight or more. When the content of the aggregation inhibitor is in the above range, the dispersion stability of the polishing composition is improved.

The content of the aggregation inhibitor in the polishing composition is preferably 0.1% by weight or less, more preferably 0.05% by weight or less, and further preferably 0.01% by weight or less. When the content of the aggregation inhibitor is in the above range, the hydrophilicity on the surface of a substrate is improved.

Herein, the term "degree of aggregation of the abrasive grains" is defined as R1/R2. R1 represents the average particle size of the particles present in the polishing composition containing the abrasive grains, the water-soluble polymer, the aggregation inhibitor, and water, and R2 represents the average particle size of the abrasive grains when the abrasive grains are dispersed in water so as to have the same concentration as the concentration of the abrasive grains in the polishing composition. The degree of aggregation of the abrasive grains is required to be 1.3 times or less, and is preferably 1.2 times or less. It is presumed that a lower degree of aggregation of the abrasive grains means that the aggregates of the abrasive grains in the polishing composition are small. Such a polishing composition has a good filtration property when a filter having a small mesh size is used.

The polishing composition may further contain a basic compound. The basic compound contained in the polishing composition has a chemical etching action against the surface of a substrate, and serves to chemically polish the surface of a substrate. The basic compound also serves to improve the dispersion stability of the polishing composition. Examples of the basic compound include ammonia, an alkali metal hydroxide, a quaternary ammonium hydroxide, and an amine. Specific examples of the basic compound include ammonia, potassium hydroxide, sodium hydroxide, tetramethylammonium hydroxide, tetraethylammonium hydroxide, methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, and N-methylpiperazine. Among them, preferable are ammonia, potassium hydroxide, sodium hydroxide, tetramethylammonium hydroxide, and tetraethylammonium hydroxide, further preferable are ammonia, potassium hydroxide, sodium hydroxide, tetramethylammonium hydroxide, or tetraethylammonium hydroxide, and most preferable is ammonia. The above-exemplified basic compounds may be used singly or in combination of two or more.

The content of the basic compound in the polishing composition is preferably 0.0001% by weight or more, more preferably 0.001% by weight or more, and further preferably 0.005% by weight or more. When the content of the basic compound is in the above range, chemical etching of the surface of a substrate is promoted, and the polishing rate of a silicon substrate is improved. In addition, the dispersion stability of the polishing composition is also improved.

The content of the basic compound in the polishing composition is preferably 0.5% by weight or less, more preferably 0.1% by weight or less, further preferably 0.05% by weight or less, and most preferably 0.01% by weight or less. When the content of the basic compound is in the above range, the smoothness of the surface of a substrate polished is improved.

Water included in the polishing composition serves to dissolve or disperse other components in the polishing composition. For example, water in which the total content of transition metal ions is 100 ppb or less is preferably used so as not to inhibit the actions of other components. Specifically, ion-exchange water from which impurity ions are removed using an ion-exchange resin and then foreign substances are removed through a filter, or pure water, ultrapure water or distillated water is preferable.

The pH of the polishing composition is preferably 8 or more, and more preferably 9 or more. In addition, the pH of the polishing composition is preferably 12 or less, and more preferably 11 or less. When the pH of the polishing composition is in the above range, a practically preferable polishing rate is achieved.

The polishing composition may further contain a surfactant. The surfactant is added, and thus roughening of the surface of a substrate, due to the chemical etching action by the basic compound, can be suppressed and the smoothness of the surface is improved.

The surfactant may be an ionic or non-ionic surfactant, but is preferably a non-ionic surfactant. When the non-ionic surfactant is used, foaming of the polishing composition is further suppressed as compared with the case where a cationic surfactant or an anionic surfactant is used, and thus the polishing composition is easily produced or used. In addition, since the non-ionic surfactant does not change the pH of the polishing composition, the pH of the polishing composition is easily controlled when the polishing composition is produced or used. Furthermore, since the non-ionic surfactant is excellent in biodegradability and is less toxic to living bodies, it is possible to reduce the impact on environment and risk in handling.

The non-ionic surfactant is not limited by its structure. Examples of the non-ionic surfactant include polyoxyalkylene adducts such as polyoxyethylene alkyl ether, polyoxyethylene alkyl phenyl ether, polyoxyethylene alkylamine, polyoxyethylene fatty acid ester, polyoxyethylene glyceryl ether fatty acid ester, and polyoxyethylene sorbitan fatty acid ester. Specific examples of the non-ionic surfactant include polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethyl hexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene stearyl amide, polyoxyethylene oleyl amide, polyoxyethylene monolauric acid ester, polyoxyethylene monostearic acid ester, polyoxyethylene distearic acid ester, polyoxyethylene monooleic acid ester, polyoxyethylene dioleic acid ester, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylenesorbit tetraoleate, a polyoxyethylene castor oil, and a polyoxyethylene hydrogenated castor oil. The surfactants may be used singly or in combination of two or more.

The weight average molecular weight of the surfactant in the polishing composition is preferably 200 or more, and more preferably 300 or more. In addition, the weight average molecular weight of the surfactant in the polishing composition is preferably 15,000 or less, and more preferably 10,000 or less. When the weight average molecular weight of the surfactant in the polishing composition is in the above range, the effect of suppressing roughening of the surface of a substrate is highly exerted.

The content of the surfactant in the polishing composition is preferably 0.00001% by weight or more, and more preferably 0.00005% by weight or more. In addition, the content of the surfactant in the polishing composition is preferably 0.1% by weight or less, and more preferably 0.05% by weight or less. When the content of the surfactant in the polishing composition is in the above range, the effect of suppressing roughening of the surface of a substrate is highly exerted.

The polishing composition may further contain component(s) selected from an organic acid, an inorganic acid, and salts thereof. Such components have the effect of improving the hydrophilicity on the surface of a silicon substrate after the substrate is polished.

Examples of the organic acid include a carboxylic acid, an aromatic carboxylic acid, an organic sulfonic acid, and an organic phosphonic acid. Specific examples of the carboxylic acid include formic acid, acetic acid, propionic acid, citric acid, oxalic acid, tartaric acid, malic acid, maleic acid, fumaric acid, and succinic acid. Specific examples of the aromatic carboxylic acid include benzoic acid and phthalic acid. Specific examples of the inorganic acid include carbonic acid, hydrochloric acid, sulfuric acid, and nitric acid. In addition, examples of a basic ion that reacts with the organic acid or the inorganic acid to form an organic salt or an inorganic salt include an ammonium ion and an alkali metal ion. Among them, an ammonium ion is preferable from the viewpoint of reducing metallic contamination on a substrate. The organic acids, inorganic acids, organic salts, or inorganic salts may be used singly or in combination of two or more.

The polishing composition may further contain a chelating agent. When the polishing composition contains a chelating agent, metallic contamination on a silicon substrate is suppressed. Examples of the chelating agent include an aminocarboxylic acid chelating agent and an organic phosphonic acid chelating agent. Specific examples of the aminocarboxylic acid chelating agent include ethylenediaminetetraacetic acid, sodium ethylenediaminetetraacetate, nitrilotriacetic acid, sodium nitrilotriacetate, ammonium nitrilotriacetate, hydroxyethyl ethylenediaminetriacetic acid, sodium hydroxyethyl ethylenediaminetriacetate, diethylenetriaminepentaacetic acid, sodium diethylenetriaminepentaacetate, triethylenetetraminehexaacetic acid, and sodium triethylenetetraminehexaacetate. Specific examples of the organic phosphonic acid chelating agent include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid.

The polishing composition of the present embodiment has the following advantages.

The polishing composition contains the water-soluble polymer, and has a degree of aggregation of the abrasive grains of 1.3 or less. Therefore, the polishing composition has a good filtration property, and imparts suitable hydrophilicity to the surface of a substrate polished, thereby reducing LPDs on the surface of a substrate. Accordingly, the polishing composition of the present embodiment can be suitably used in applications to polishing the surface of a substrate, in particular, applications to final polishing of the surface of a silicon substrate which is required to have a high substrate surface accuracy.

The embodiment may be modified as follows.

The polishing composition of the embodiment may further contain known additives such as a preservative agent and a mildew-proofing agent, if necessary. Specific examples of the preservative agent and the mildew-proofing agent include an isothiazoline compound, paraoxybenzoates, and phenoxyethanol.

The polishing composition of the present invention may be a one-component composition, or a multi-component composition containing two or more components.

The polishing composition of the embodiment may be produced by dissolving or dispersing the above-described components other than water in water by an ordinary method. The order of the respective components to be dissolved or dispersed in water is not particularly limited. The dissolution or dispersion method is not also particularly limited. For example, a common method such as stirring using a propeller stirrer or dispersion using a homogenizer can be used.

The polishing composition of the present invention may be in the state of a concentrated stock solution when being produced or sold. When the polishing composition is in a form of a concentrated stock solution, the volume of the polishing composition is smaller, and thus the cost for conveyance or storage can be reduced. The concentration rate of the stock solution of the polishing composition is preferably 5 times or more, more preferably 10 times or more, and further preferably 20 times or more, but is not limited thereto. Herein, the concentration rate refers to the ratio of the volume of the polishing composition after diluting to the volume of the stock solution of the polishing composition.

The polishing composition of the embodiment and the stock solution of the polishing composition may be diluted 5 to 60 times in use. In this case, since the polishing composition and the stock solution of the polishing composition maintain good dispersibility of the abrasive grains, they exhibit a good filtration property. Additionally, the solution diluted is subjected to filtration and then used for polishing, thereby enabling LPDs on the surface of a substrate polished to be further reduced.

The polishing composition of the embodiment may also be used in applications to polishing a substrate other than a silicon substrate. Specific examples of such a substrate include a silicon oxide substrate, a plastic substrate, a glass substrate, and a quartz substrate.

The polishing composition of the embodiment may also be subjected to a filtration treatment and then used for polishing. The mesh size of a filter for use in the filtration treatment is preferably 10 μm or less, more preferably 1 μm or less, and further preferably 0.5 μm or less, from the viewpoint of removing fine foreign substances. In addition, the material and structure of the filter for use in the filtration step are not particularly limited. Examples of the material of the filter include nylon, polysulfone, polyethersulfone, polypropylene, polytetrafluoroethylene (PTFE), polycarbonate, cellulose ester, and glass. The material of the filter is preferably nylon, polyethersulfone, or polypropylene, and more preferably nylon, from the viewpoint of filtration flow rate.

Then, Examples and Comparative Examples of the present invention will be described.

Each of polishing composition in Examples 1 to 19 and Comparative Examples 1 to 6 was prepared by mixing a part of or the entire of colloidal silica, a water-soluble polymer, an aggregation inhibitor, a basic compound, and a salt with ion-exchange water. The formulation of each of the polishing composition in Examples 1 to 19 and Comparative Examples 1 to 6 is shown in Table 1.

The average particle size of the colloidal silica was measured in accordance with a dynamic light scattering method using UPA-UT151 manufactured by Nikkiso Co., Ltd. The average particle size of the colloidal silica abrasive grains used in each of Examples 1 to 19 and Comparative Examples 1 to 6 is shown in the column "Particle size" in the column "Colloidal silica" in Table 1. This corresponds to R2 in the definition of the degree of aggregation of the abrasive grains. In addition, with respect to each of the polishing compositions in Examples 1 to 19 and Comparative Examples 1 to 6, the average particle size R1 of the particles present in the polishing compositions was determined in the same manner, and is shown in the column "Average particle size of particles in polishing composition" in Table 1. This corresponds to R1 in the definition of the degree of aggregation of the abrasive grains. R1 was divided by R2 to thereby determine the degree of aggregation of the abrasive grains. The resulting value is shown in the column "Degree of aggregation of abrasive grains" in Table 1.

In the column "Water-soluble polymer" in Table 1, HEC represents hydroxyethylcellulose, and CMC represents carboxymethylcellulose. In addition, in the column "Aggregation inhibitor" in Table 1, PVP represents polyvinylpyrrolidone, Si oil represents polyether-modified silicone, and Al represents a polyoxyethylene-polyoxypropylene-polyoxyethylene triblock copolymer. Furthermore, in the column "Salt" in Table 1, B1 represents triammonium citrate.

The filtration property of the polishing composition was evaluated as follows. With respect to each of the polishing compositions in Examples 1 to 19 and Comparative Examples 1 to 6, suction filtration was performed under the conditions listed in Table 2 for 5 minutes, and the volume of the polishing composition passing through the filter was measured. In the column "Filtration property" in Table 1, "A" means that the volume of the polishing composition passing through the filter was 200 ml or more, "B" means that the volume was 100 ml or more and less than 200 ml, and "C" means that the volume was less than 100 ml.

The hydrophilicity on the surface of a substrate imparted by the polishing composition was evaluated by the method described below. First, a silicon wafer having a diameter of 200 mm, a conductive type of P, a crystal orientation of <100>, and a resistivity of 0.1 Ω·cm or more and less than 100 Ω·cm was cut into chips having a square of 60 mm side to produce silicon substrates. Each of the silicon substrates was preliminarily polished by using a polishing slurry (trade name: GLANZOX 2100) manufactured by Fujimi Incorporated. Thereafter, each of the polishing compositions in Examples 1 to 19 and Comparative Examples 1 to 6 was used to polish each of the silicon substrates under the conditions in Table 3. Then, the surface of each of the silicon substrates was rinsed with running water at a flow rate of 7 L/min for 10 seconds, each of the silicon substrates was vertically stood and left to stand for 30 seconds, and thereafter, the maximum distance from an edge portion to a wet portion of each of the silicon substrates, namely, the maximum water-repellent distance was measured. It is indicated that the longer the maximum water-repellent distance is, the poorer the hydrophilicity on the surface of each of the silicon substrates is. In the column "Hydrophilicity" in Table 1, "A" means that the maximum water-repellent distance was 5 mm or shorter, and "B" means that the water-repellent distance was longer than 5 mm.

TABLE 1

| | Colloidal silica | | Water-soluble polymer | | | Aggregation inhibitor | | | Basic compound Type |
|---|---|---|---|---|---|---|---|---|---|
| | Particle size [nm] | Amount added [wt. %] | Type | Weight average molecular weight | Amount added [wt. %] | Type | Weight average molecular weight | Amount added [wt. %] | |
| Ex. 1 | 61.0 | 0.46 | HEC | 250000 | 0.017 | PVP A1 | 60000 9000 | 0.0052 0.0005 | Ammonia |
| Ex. 2 | 61.0 | 0.46 | HEC | 250000 | 0.017 | PVP A1 | 60000 9000 | 0.0052 0.0005 | Ammonia |
| Ex. 3 | 61.0 | 0.46 | HEC | 250000 | 0.017 | Si oil | 4500 | 0.0250 | Ammonia |
| Ex. 4 | 61.0 | 0.23 | HEC | 250000 | 0.017 | PVP | 3000 | 0.0027 | Ammonia |
| Ex. 5 | 61.0 | 0.23 | HEC | 250000 | 0.017 | PVP | 3000 | 0.0054 | Ammonia |
| Ex. 6 | 61.0 | 0.23 | HEC | 250000 | 0.017 | PVP | 3000 | 0.0059 | Ammonia |
| Ex. 7 | 61.0 | 0.23 | HEC | 250000 | 0.017 | PVP | 3000 | 0.0067 | Ammonia |
| Ex. 8 | 61.0 | 0.23 | HEC | 250000 | 0.017 | PVP | 3000 | 0.0080 | Ammonia |
| Ex. 9 | 61.0 | 0.23 | HEC | 250000 | 0.017 | PVP | 60000 | 0.0024 | Ammonia |
| Ex. 10 | 61.0 | 0.23 | HEC | 250000 | 0.017 | PVP | 60000 | 0.0027 | Ammonia |
| Ex. 11 | 61.0 | 0.23 | HEC | 250000 | 0.017 | PVP | 60000 | 0.0029 | Ammonia |
| Ex. 12 | 61.0 | 0.23 | HEC | 250000 | 0.017 | PVP | 60000 | 0.0049 | Ammonia |
| Ex. 13 | 61.0 | 0.23 | HEC | 250000 | 0.017 | PVP | 60000 | 0.0054 | Ammonia |
| Ex. 14 | 61.0 | 0.23 | HEC | 250000 | 0.017 | PVP | 250000 | 0.0029 | Ammonia |
| Ex. 15 | 61.0 | 0.23 | HEC | 500000 | 0.034 | PVP | 250000 | 0.0300 | Ammonia |
| Ex. 16 | 42.0 | 0.18 | HEC | 500000 | 0.009 | PVP | 60000 | 0.0054 | Ammonia |
| Ex. 17 | 42.0 | 0.18 | HEC | 120000 | 0.001 | PVP | 60000 | 0.0001 | Ammonia |
| Ex. 18 | 42.0 | 0.18 | HEC | 120000 | 0.004 | PVP | 60000 | 0.0001 | Ammonia |
| Ex. 19 | 24.0 | 0.01 | CMC | 50000 | 0.049 | PVP | 60000 | 0.0450 | Ammonia |
| Com. Ex. 1 | 61.0 | 0.23 | HEC | 250000 | 0.017 | | | | Ammonia |
| Com. Ex. 2 | 61.0 | 0.23 | HEC | 250000 | 0.017 | PVP | 3000 | 0.0007 | Ammonia |
| Com. Ex. 3 | 61.0 | 0.23 | HEC | 250000 | 0.017 | PVP | 3000 | 0.0014 | Ammonia |
| Com. Ex. 4 | 61.0 | 0.23 | HEC | 250000 | 0.017 | PVP | 3000 | 0.0019 | Ammonia |
| Com. Ex. 5 | 61.0 | 0.23 | HEC | 250000 | 0.017 | PVP | 60000 | 0.0007 | Ammonia |
| Com. Ex. 6 | 42.0 | 0.18 | HEC | 500000 | 0.009 | | | | Ammonia |

| | Basic compound Amount added [wt. %] | Salt Type | Salt Amount added [wt. %] | Average particle size of particles in polishing composition [nm] | Degree of aggregation of abrasive grains | Filtration property | Hydrophilicity |
|---|---|---|---|---|---|---|---|
| Ex. 1 | 0.009 | | | 61.0 | 1.00 | A | B |
| Ex. 2 | 0.009 | B1 | 0.008 | 62.0 | 1.02 | A | A |
| Ex. 3 | 0.009 | | | 63.4 | 1.04 | A | B |
| Ex. 4 | 0.008 | | | 78.4 | 1.29 | B | B |
| Ex. 5 | 0.008 | | | 63.8 | 1.05 | A | B |
| Ex. 6 | 0.008 | B1 | 0.002 | 62.7 | 1.03 | A | A |
| Ex. 7 | 0.008 | | | 60.7 | 1.00 | A | A |
| Ex. 8 | 0.008 | | | 62.8 | 1.03 | A | A |
| Ex. 9 | 0.008 | | | 72.6 | 1.19 | A | B |
| Ex. 10 | 0.008 | | | 63.4 | 1.04 | A | B |
| Ex. 11 | 0.008 | B1 | 0.005 | 69.2 | 1.14 | A | A |

TABLE 1-continued

| | | | | | |
|---|---|---|---|---|---|
| Ex. 12 | 0.008 | 63.3 | 1.04 | A | B |
| Ex. 13 | 0.008 | 62.2 | 1.02 | A | A |
| Ex. 14 | 0.008 | 74.4 | 1.22 | B | B |
| Ex. 15 | 0.030 | 62.8 | 1.03 | A | B |
| Ex. 16 | 0.005 | 49.0 | 1.17 | A | B |
| Ex. 17 | 0.002 | 42.0 | 1.00 | A | B |
| Ex. 18 | 0.002 | 42.4 | 1.01 | A | B |
| Ex. 19 | 0.001 | 24.0 | 1.00 | A | B |
| Com. Ex. 1 | 0.008 | 88.9 | 1.46 | C | A |
| Com. Ex. 2 | 0.008 | 86.4 | 1.42 | C | A |
| Com. Ex. 3 | 0.008 | 84.3 | 1.38 | C | A |
| Com. Ex. 4 | 0.008 | 83.2 | 1.36 | C | B |
| Com. Ex. 5 | 0.008 | 85.9 | 1.41 | C | B |
| Com. Ex. 6 | 0.005 | 56.5 | 1.35 | C | A |

TABLE 2

| | |
|---|---|
| Filtration method: | Suction filtration |
| Filtration differentialpressure: | 50 kPa |
| Filtration time: | 5 minutes |
| Type of filter: | OMNIPORE MEMBRANE (disc type) (manufactured by Nihon Millipore K.K.) |
| Filter diameter: | 47 mm |
| Filter mesh size: | 5.0 μm |

TABLE 3

| | |
|---|---|
| Polishing machine: | Bench-type polishing machine EJ-380IN (made by Engis Japan Corporation) |
| Load for polishing: | 15 kPa |
| Table rotation speed: | 30 rpm |
| Head rotation speed: | 30 rpm |
| Time for polishing: | 1 minute |
| Temperature of polishing composition: | 20° C. |
| Supply rate of polishing composition: | 0.25 L/min (pouring onto the wafer) |

As shown in Table 1, it was found that each of the polishing compositions in Examples 1 to 19 exhibited a high filtration property and imparted hydrophilicity to the surface of a silicon substrate polished, unlike each of the polishing compositions in Comparative Examples 1 to 6.

The invention claimed is:

1. A polishing composition comprising:
   abrasive grains selected from the group consisting of silicon carbide abrasive grains, silicon dioxide abrasive grains, alumina abrasive grains, zirconia abrasive grains, calcium carbonate abrasive grains, diamond abrasive grains, and combinations thereof;
   at least one water-soluble polymer selected from the group consisting of celluloses and polysaccharides;
   at least one aggregation inhibitor selected from the group consisting of vinyl-based water-soluble polymers, oxyalkylene polymers, and oxyalkylene copolymers; and
   water,
   wherein when an average particle size of the particles present in the polishing composition is defined as R1 and an average particle size of the abrasive grains in the case where the abrasive grains are dispersed in water so as to have the same concentration as the concentration of the abrasive grains in the polishing composition is defined as R2, R1/R2 is 1.3 or less.

2. The polishing composition according to claim 1, wherein the water-soluble polymer is a cellulose.

3. A method for polishing a silicon substrate, comprising:
   providing a silicon substrate; and
   polishing the silicon substrate by using the polishing composition according to claim 1.

4. A method for producing a silicon substrate, comprising polishing a silicon substrate by using the polishing method according to claim 3.

5. A method for polishing a silicon substrate, comprising:
   providing a silicon substrate; and
   polishing the silicon substrate by using the polishing composition according to claim 2.

6. A method for producing a silicon substrate, comprising polishing a silicon substrate by using the polishing method according to claim 5.

7. The polishing composition according to claim 1, wherein the aggregation inhibitor has a weight average molecular weight of 300 to 2,000,000.

8. The polishing composition according to claim 1, wherein the water-soluble polymer has a weight average molecular weight of 10,000 to 2,000,000.

9. The polishing composition according to claim 1, wherein the abrasive grains are colloidal silica.

10. The polishing composition according to claim 1, wherein the abrasive grains have an aspect ratio greater than 1 and not more than 4.0.

11. The polishing composition according to claim 1, wherein the at least one aggregation inhibitor is selected from the group consisting of vinyl-based water-soluble polymers and oxyalkylene polymers.

12. The polishing composition according to claim 1, wherein the at least one aggregation inhibitor is selected from the group consisting of vinyl-based water-soluble polymers and polyethylene glycol.

13. The polishing composition according to claim 1, wherein the at least one aggregation inhibitor is one or more vinyl-based water-soluble polymers.

14. The polishing composition according to claim 1, wherein the at least one aggregation inhibitor is selected from the group consisting of polyvinylpyrrolidone, polyvinylcaprolactam, polyacrylamide, polyacrylic acid, and polyethylene glycol.

* * * * *